United States Patent
Lin et al.

[11] Patent Number: 6,083,827
[45] Date of Patent: Jul. 4, 2000

[54] METHOD FOR FABRICATING LOCAL INTERCONNECT

[75] Inventors: Tony Lin, Kaohsiung Hsien; Coming Chen, Taoyuan Hsien; Wen-Kuan Yeh, Hsinchu Hsien, all of Taiwan

[73] Assignee: United Microelectronics Corp., Hsinchu, Taiwan

[21] Appl. No.: 09/212,084

[22] Filed: Dec. 15, 1998

[51] Int. Cl.[7] .............................. H01L 21/4763
[52] U.S. Cl. .................. 438/631; 438/233; 438/618; 438/230; 438/303
[58] Field of Search ................. 438/631, 618, 438/621, 299–307, 229–233

[56] References Cited

U.S. PATENT DOCUMENTS

| | | | |
|---|---|---|---|
| 5,411,909 | 5/1995 | Manning et al. | 438/305 |
| 5,466,636 | 11/1995 | Cronin et al. | 438/392 |
| 5,773,310 | 6/1998 | Park | 438/303 |
| 5,840,609 | 11/1998 | Hyeon et al. | 438/299 |
| 5,897,357 | 4/1999 | Wu et al. | 438/300 |
| 6,030,876 | 2/2000 | Koike | 438/303 |

*Primary Examiner*—Charles Bowers
*Assistant Examiner*—Thanh Nguyen
*Attorney, Agent, or Firm*—Thomas, Kayden, Horstemeyer & Risley

[57] ABSTRACT

A method for fabricating a local interconnect. A gate having a gate oxide layer, a gate polysilicon layer and a cap layer is formed on a provided substrate. A spacer is formed on the sidewall of the gate, and a source/drain region is formed in the substrate. A planarized dielectric layer is formed over the substrate to expose the cap layer. A portion of the dielectric layer and the spacer on one side of the gate is removed to form an opening, so that the source/drain region is exposed. The opening is transformed into a local-interconnect opening by removing the cap layer. A local interconnect is formed by forming a conductive layer in the local-interconnect opening.

20 Claims, 5 Drawing Sheets

METHOD FOR FABRICATING LOCAL INTERCONNECT

BACKGROUND OF THE INVENTION

1. Field of the Invention

The present invention relates to a method of manufacturing a local interconnect. More particularly, the present invention relates to a method for simultaneously fabricating a gate conductive layer and a local interconnect.

2. Description of the Related Art

As the integration of integrated circuits is increased, the surface area of a chip available for forming interconnects becomes more and more limited due to the shrinking dimensions of devices. Because the number of interconnects required for electrical connection between devices or electrodes is increased, two or more conductive layers are designed to meet the requirements of high integration and limited surface area.

Local interconnect is an interconnect process used to improve the integration of semiconductor devices by locally connecting a gate and a source/drain region.

FIGS. 1A through 1D are schematic, cross-sectional diagrams used to depict steps in a conventional method for fabricating a local interconnect.

Referring to FIG. 1A, an isolation region 11 is formed in a provided substrate 10 to define active regions 20a, 20b. Patterned gate oxide layers 12a, 12b and patterned gate polysilicon layers 13a, 13b are formed in sequence in the active regions 20a, 20b, respectively. Also, source/drain regions 14a, 14b are formed in the active regions 20a, 20b, respectively. Spacers 15a, 15b are formed on the sidewall of the polysilicon layers 13a, 13b.

Referring to FIG. 1B, a self-aligned silicide process is performed, thus silicide layers 16a, 16b, 17a and 17b are formed on the source/drain region 14a, 14b and the gate polysilicon layer 13a, 13b, respectively. The material used to form the silicide layer is titanium silicon.

Referring to FIG. 1C, a titanium nitride layer 18 is formed over the substrate 10. A patterned photoresist layer 19 is formed on the titanium layer 18 to define a region of a subsequently formed local interconnect.

Referring to FIG. 1D, a portion of the titanium nitride layer 18 exposed by the photoresist layer 19 is removed by etching. Then, the photoresist layer 19 is removed. A titanium nitride layer 18a is formed as a local interconnect.

The silicide layer, which can reduce the sheet resistance of the gate polysilicon layer and the source/drain region, is formed by performing the self-aligned silicide process. Then, the titanium nitride layer 18a is formed as a local interconnect to connect the source/drain region 14b and the gate polysilicon layer 13b through the silicide layer 16b and 17b. However, as the linewidth of the gate is reduced, a narrow linewidth effect occurs. Thus, the sheet resistance is increased, the conductivity of the silicide layer and the performance of devices are reduced.

SUMMARY OF THE INVENTION

Accordingly, the present invention provides a method for fabricating a local interconnect which integrates the gate process and the local interconnect process.

To achieve these and other advantages and in accordance with the purpose of the invention, as embodied and broadly described herein, the invention provides a method for fabricating a local interconnect. The method for fabricating a local interconnect includes the following steps. An isolation region is formed in a provided substrate to define a first active region and a second active region. A first gate and a second gate are formed on the first active region and the second active region, respectively. A first spacer and a second spacer are formed on the sidewall of the first gate and the second gate, respectively. A first source/drain region and a second source/drain region are formed in the first active region and the second active region, respectively. A planarized dielectric layer is formed over the substrate, wherein the planarized dielectric layer exposes a first cap layer of the first gate and a second cap layer of the second gate. A portion of the dielectric layer and the second spacer on one side of the second gate is removed to form a first opening. The second source/drain region and one side of the second gate are exposed by the first opening. A second opening is formed by removing the first cap layer and the first opening is transformed into a local-interconnect opening by removing the second cap layer. A conductive layer is formed over the substrate. A gate conductive layer and a local interconnect are formed by planarizing the conductive layer.

It is to be understood that both the foregoing general description and the following detailed description are exemplary, and are intended to provide further explanation of the invention as claimed.

DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
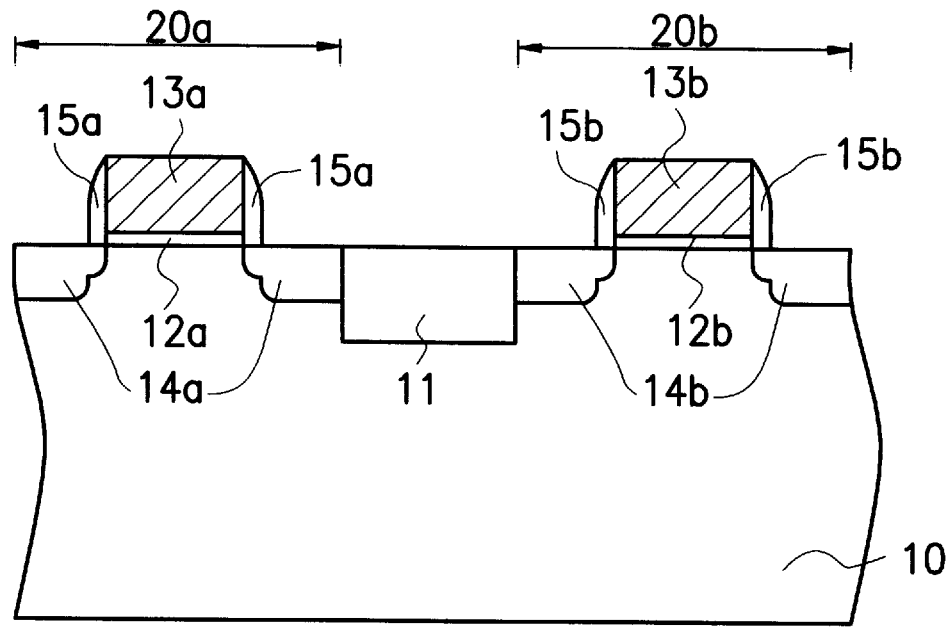
FIGS. 1A through 1D are schematic, cross-sectional diagrams used to depict steps in a conventional method for fabricating a local interconnect.
Figure 1B:
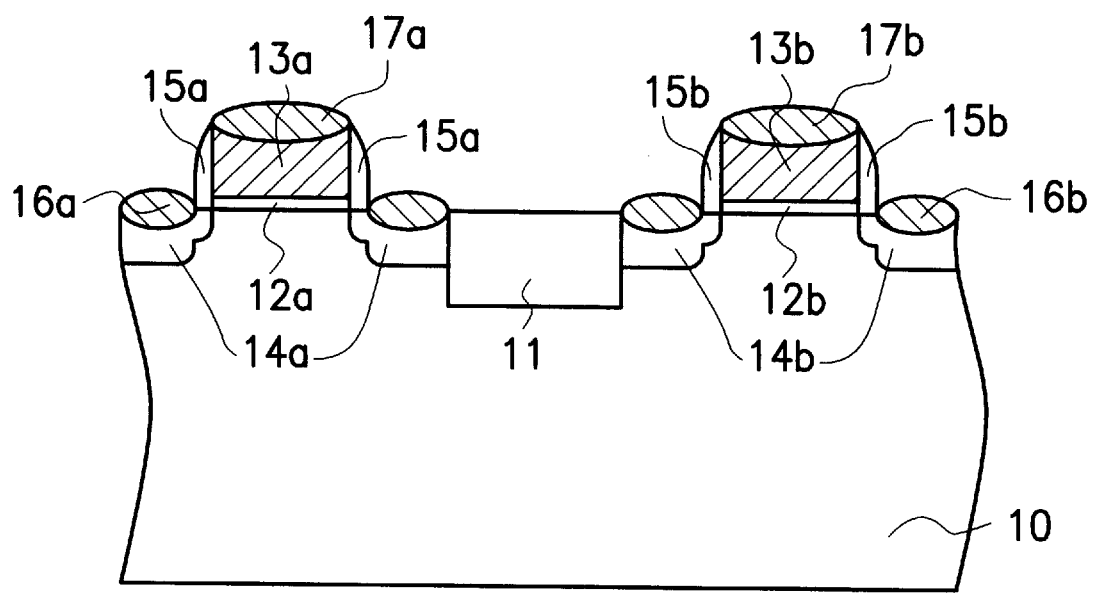
Figure 1C:
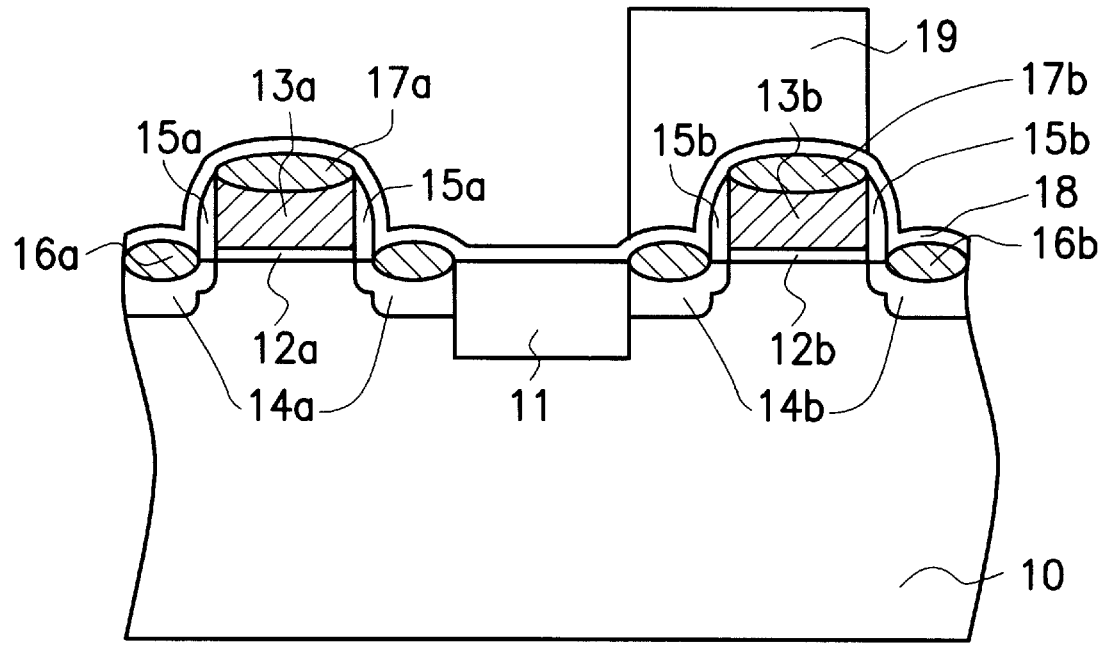
Figure 1D:
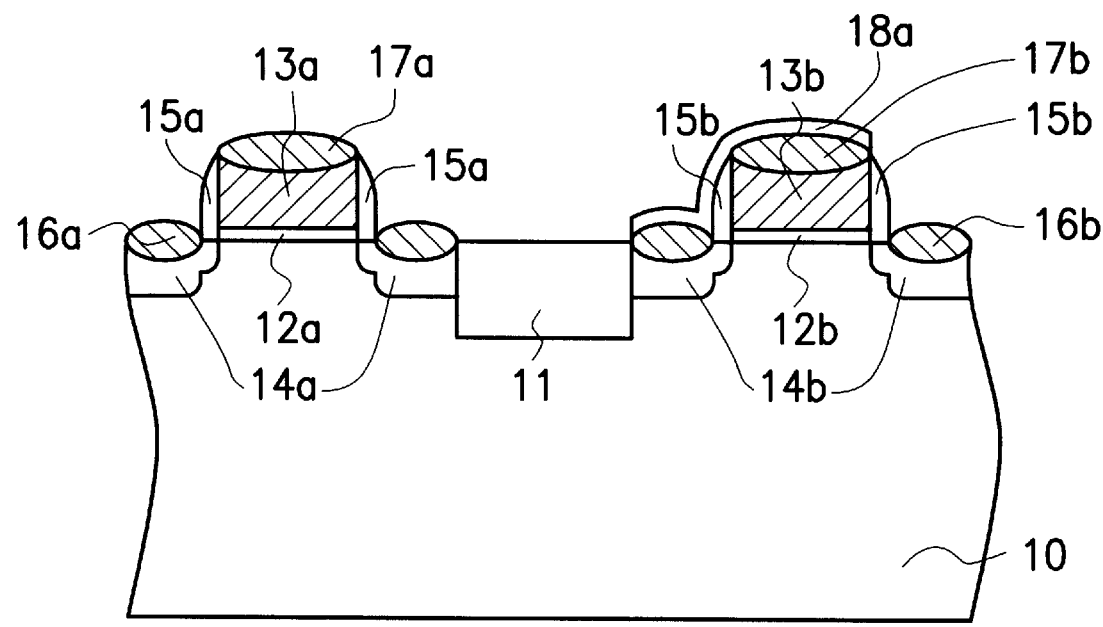

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic, cross-sectional diagrams used to depict steps in a method according to the invention for fabricating a local interconnect.

Figure 2A:
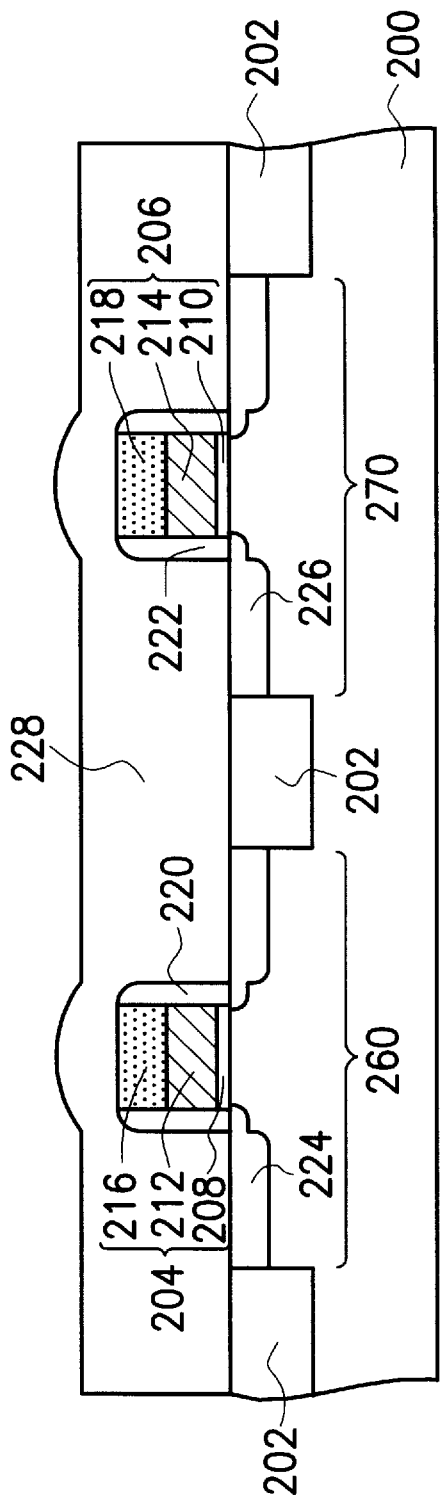
FIGS. 2A through 2E are schematic, cross-sectional diagrams used to depict steps in a method according to the invention for fabricating a local interconnect.

Referring to FIG. 2A, a substrate 200 is provided. An isolation region 202 is formed in the substrate 200 to define active regions 260, 270. Preferably, the step of forming the isolation region 202 includes shallow trench isolation. Gates 204, 206 are formed in the active regions 260 and 270, respectively. The gate 204 is made of a gate oxide layer 208, a gate polysilicon layer 212 and a cap layer 216. The gate 206 is also made of a gate oxide layer 210, a gate polysilicon layer 214 and a cap layer 218. Spacers 220, 222 are formed on the sidewalls of the gates 204 and 206, respectively. Additionally, source/drain regions 224, 226 are formed in the active regions 260 and 70, respectively. The spacers 220 and 222 include silicon dioxide, silicon nitride or silicon-oxy-nitride. Preferably, the source/drain regions 224 and 226 include lightly doped drains. A dielectric layer 228 is formed over the substrate 200 by, for example, chemical vapor deposition. The dielectric layer 228 includes silicon dioxide or borophosphosilicate glass (BPSG).

Figure 2B:
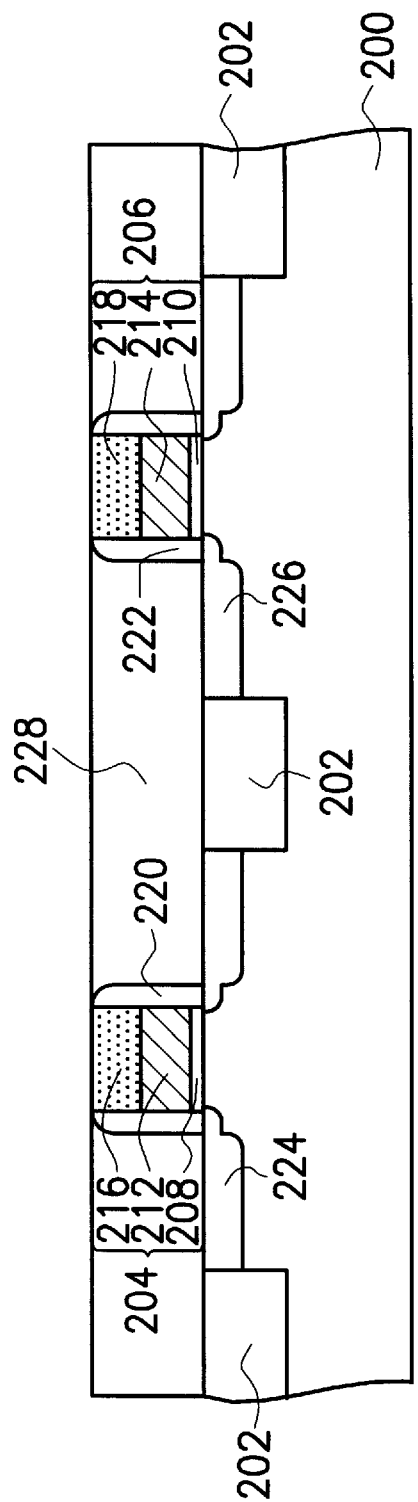

Referring to FIG. 2B, the dielectric layer 228 is planarized to expose the cap layer 216 and the cap layer 218. Preferably, the step of planarizing the dielectric layer 228 includes chemical-mechanical polishing.

Figure 2C:
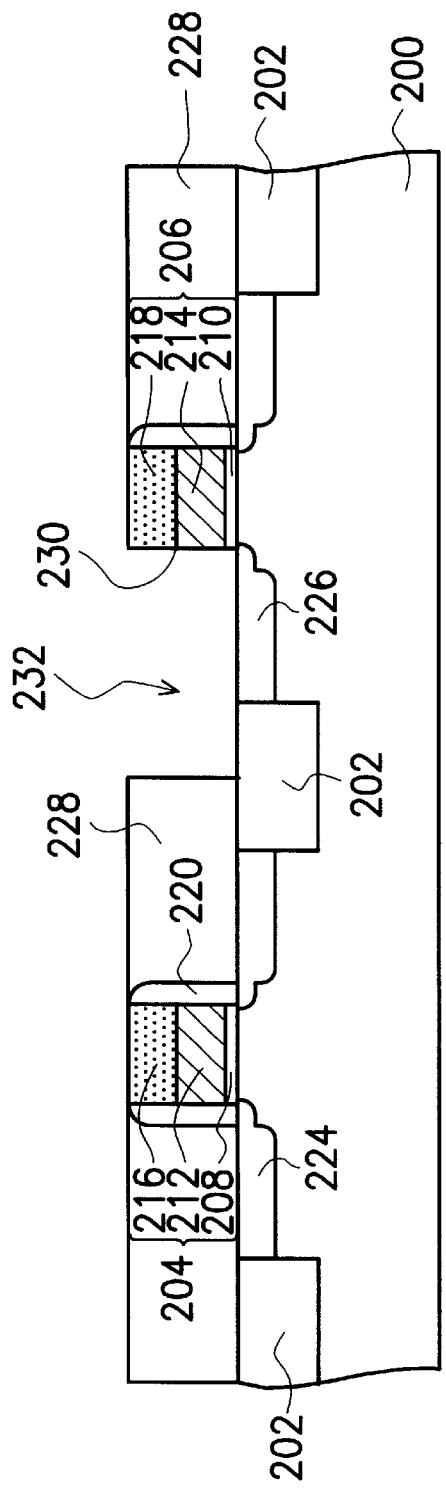

Referring to FIG. 2C, a portion of the dielectric layer 228 and the spacer 222 (FIG. 2B) on the sidewall 230 of the gate 206 are removed to form an opening 232. The source/drain region 226 and the sidewall 230 of the gate 206 are exposed by the opening 232.

Figure 2D:
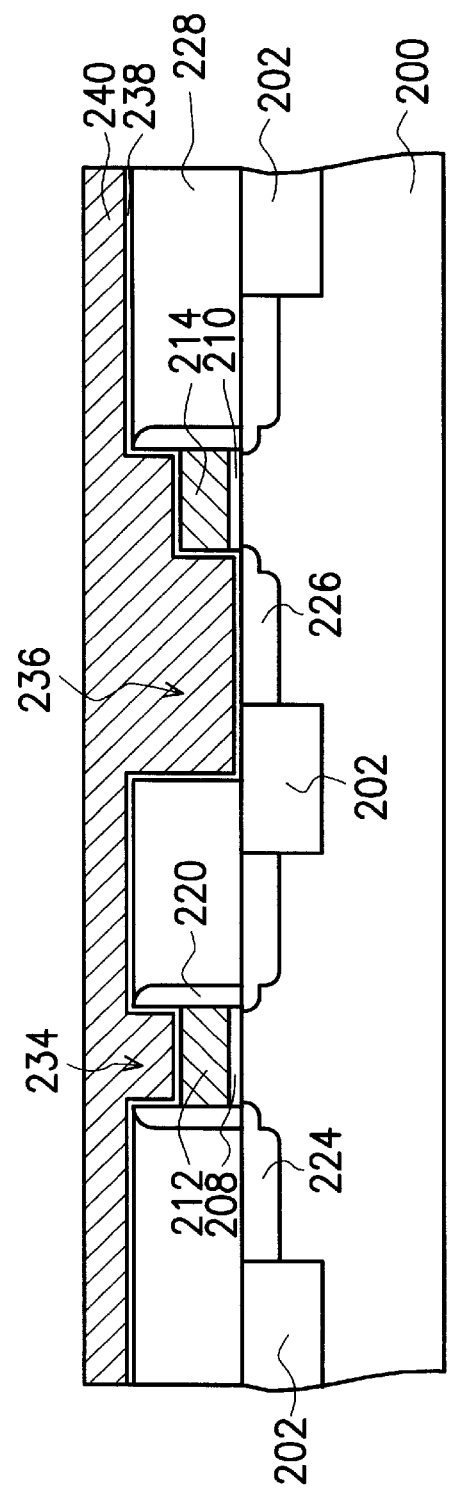

Referring to FIG. 2D, the cap layer 216 is removed to form an opening 234, which exposes the gate polysilicon layer 212. Additionally, the cap layer 218 is removed to transform the opening 232 into a local-interconnect opening 236. A conformal barrier layer 238 is formed over the substrate 200. A conductive layer 240 is formed over the substrate 200 and fills the opening 234 and the local-interconnect opening 236. The conductive layer 240 includes metal such as tungsten or copper. The step of forming the conductive layer 240 includes chemical vapor deposition, sputtering or electroplating. When the conductive layer 240 is formed by tungsten, the barrier layer 238 includes titanium, titanium nitride, tungsten nitride or tungsten-silic-nitride ($WSi_xN_y$). When the conductive layer 240 is formed by copper, the barrier layer 238 includes tantalum or tantalum nitride.

Figure 2E:
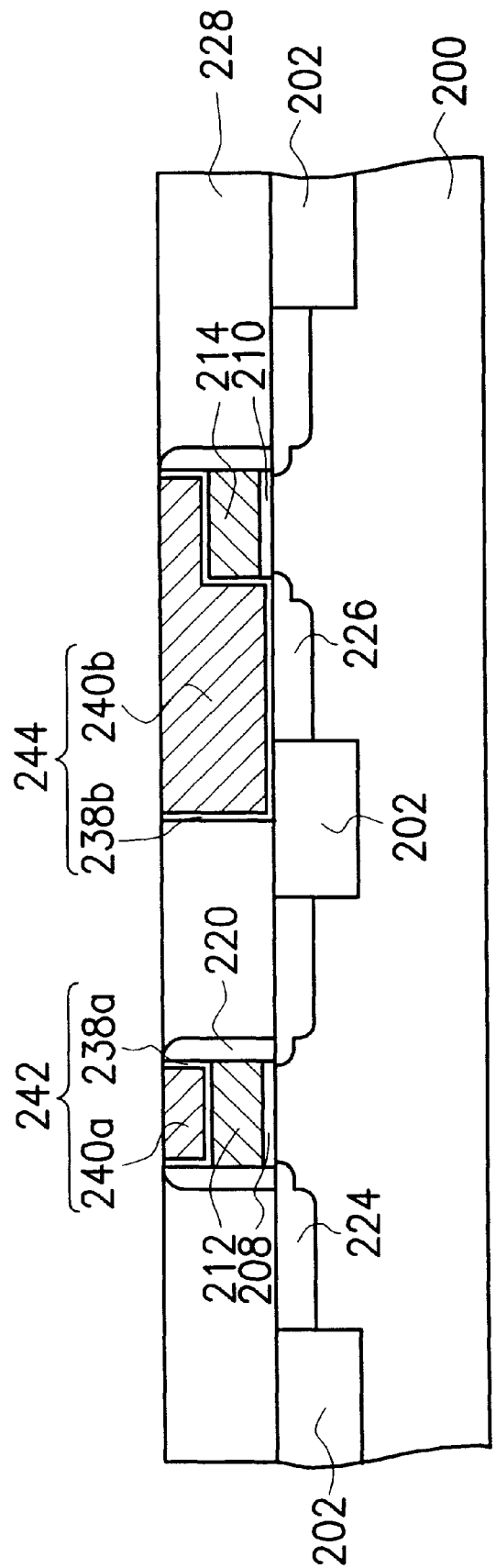

Referring to FIG. 2E, a portion of the conductive layer 240 and a portion of the barrier layer 238 are removed to expose the dielectric layer 228, so that a gate conductive layer 242 and a local interconnect 244 are formed. The gate conductive layer 242 is made of a conductive layer 240a and a barrier layer 238a; the local interconnect 244 is also made of a conductive layer 240b and a barrier layer 238b. The steps of removing the conductive layer 240 and the barrier layer 238 include polishing the conductive layer 240 to expose the barrier layer 238 and removing the barrier layer 238 by wet etching to expose the dielectric layer 228.

In this invention, the gate conductive layer 242 and the local interconnect 244 are formed simultaneously over the substrate 200. Additionally, the gate conductive layer 242 and the local interconnect 244 are formed by metal, thus the conductivity of the gate and the local interconnect is increased and the performance of devices is improved, as well. Also, the problem of the sheet resistance is avoided because the silicide layer is not formed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a local interconnect, comprising the steps of:

providing a substrate;

forming a patterned gate oxide layer, a patterned polysilicon layer and a patterned cap layer in sequence on the substrate, so that a gate comprising the patterned gate oxide layer, the patterned gate polysilicon layer and the patterned cap layer is formed;

forming a spacer on the sidewall of the gate;

forming a source/drain region in the substrate;

forming a planarized dielectric layer over the substrate, wherein the planarized dielectric layer exposes the cap layer;

removing a portion of the dielectric layer and the spacer on one side of the gate to form an opening, so that the source/drain region is exposed;

removing the cap layer to transform the opening into a local-interconnect opening; and forming a conductive layer in the local-interconnect opening to form a local interconnect.

2. The method of claim 1, wherein the step of forming the planarized dielectric layer further comprises forming a dielectric layer over the substrate; and removing a portion of the dielectric layer by a planarizing process to expose the cap layer.

3. The method of claim 2, wherein the planarizing process includes chemical-mechanical polishing.

4. The method of claim 1, wherein the conductive layer includes metal.

5. The method of claim 4, wherein the conductive layer includes tungsten.

6. The method of claim 4, wherein the conductive layer includes copper.

7. The method of claim 4, wherein a conformal barrier layer is formed over the substrate before forming the conductive layer.

8. The method of claim 1, wherein the material used to form the conformal barrier layer is selected from a group consisting of titanium, titanium nitride, tungsten nitride, tungsten-silic-nitride, tantalum and tantalum nitride.

9. The method of claim 1, wherein the step of forming the local interconnect includes a planarizing process.

10. The method of claim 9, wherein the planarizing process includes chemical-mechanical polishing.

11. A method for fabricating a local interconnect, comprising the steps of:

providing a substrate;

forming an isolation region in the substrate to define a first active region and a second active region;

forming a first gate and a second gate in the first active region and the second active region, respectively, wherein the first gate comprises a first gate oxide layer, a first gate polysilicon layer and a first cap layer and the second gate comprises a second gate oxide layer, a second gate polysilicon layer and a second cap layer;

forming a first spacer and a second spacer on the sidewall of the first gate and the second gate, respectively;

forming a first source/drain region and a second source/drain region in the first active region and the second active region, respectively;

forming a planarized dielectric layer over the substrate, wherein the planarized dielectric layer exposes the first cap layer and the second cap layer;

removing a portion of the dielectric layer and the second spacer on one side of the second gate to form a first opening, wherein the second source/drain region is exposed;

removing the first cap layer and the second cap layer, so that a second opening is formed to expose the second gate polysilicon layer and the first opening is transformed into a local-interconnect opening; and filling the second opening and the local-interconnect opening with a conductive layer, so that a gate conductive layer and a local interconnect are formed.

12. The method of claim 11, wherein the step of forming the planarized dielectric layer further comprises forming a dielectric layer over the substrate; and removing a portion of the dielectric layer by a planarizing process to expose the cap layer.

13. The method of claim 12, wherein the planarizing process includes chemical-mechanical polishing.

14. The method of claim 11, wherein the first conductive layer and the second conductive layer include metal.

15. The method of claim 14, wherein the first conductive layer and the second conductive layer include tungsten.

16. The method of claim 14, wherein the first conductive layer and the second conductive layer include copper.

17. The method of claim 14, wherein a conformal barrier layer is formed over the substrate before the first conductive layer and the second conductive layer are formed.

18. The method of claim 17, wherein the material used to form the conformal barrier layer is selected from a group consisting of titanium, titanium nitride, tungsten nitride, tungsten-silic-nitride, tantalum and tantalum nitride.

19. The method of claim 1, wherein the step of forming the gate conductive layer and the local interconnect includes a planarizing process.

20. The method of claim 19, wherein the planarizing process includes chemical-mechanical polishing.

* * * * *